United States Patent
Yashima et al.

(10) Patent No.: US 8,429,575 B2
(45) Date of Patent: Apr. 23, 2013

(54) METHOD FOR RESIZING PATTERN TO BE WRITTEN BY LITHOGRAPHY TECHNIQUE, AND CHARGED PARTICLE BEAM WRITING METHOD

(75) Inventors: Jun Yashima, Kanagawa (JP); Junichi Suzuki, Saitama (JP); Takayuki Abe, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/275,448

(22) Filed: Oct. 18, 2011

(65) Prior Publication Data

US 2012/0036486 A1 Feb. 9, 2012

Related U.S. Application Data

(62) Division of application No. 11/851,176, filed on Sep. 6, 2007, now Pat. No. 8,065,635.

(30) Foreign Application Priority Data

Sep. 14, 2006 (JP) .................. 2006-249141

(51) Int. Cl.
G06F 17/50 (2006.01)
(52) U.S. Cl.
USPC .................. 716/55; 716/50; 716/51; 716/52; 716/53
(58) Field of Classification Search .............. 716/50–53, 716/55
See application file for complete search history.

(56) References Cited

U.S. PATENT DOCUMENTS

| 6,335,981 | B1 | 1/2002 | Harazaki |
| 7,279,259 | B2 | 10/2007 | Ito et al. |
| 2002/0051916 | A1 | 5/2002 | Ki |
| 2003/0093767 | A1 | 5/2003 | Murai et al. |
| 2004/0229472 | A1 | 11/2004 | Kobayashi |
| 2006/0051684 | A1 | 3/2006 | Jang et al. |
| 2007/0192757 | A1 | 8/2007 | Emi et al. |
| 2008/0182185 | A1 | 7/2008 | Abe et al. |
| 2010/0055587 | A1 | 3/2010 | Fujimura et al. |

FOREIGN PATENT DOCUMENTS

| JP | 2003-43661 | 2/2003 |
| JP | 2004-279950 | 10/2004 |

OTHER PUBLICATIONS

U.S. Appl. No. 13/288,530, filed Nov. 3, 2011, Yashima.
U.S. Appl. No. 13/323,986, filed Dec. 13, 2011, Emi, et al.

*Primary Examiner* — Stacy Whitmore
(74) *Attorney, Agent, or Firm* — Oblon, Spivak, McClelland, Maier & Neustadt, L.L.P.

(57) ABSTRACT

A method for resizing a pattern to be written by using lithography technique includes calculating a first dimension correction amount of a pattern for correcting a dimension error caused by a loading effect, for each small region made by virtually dividing a writing region of a target workpiece into meshes of a predetermined size, based on an area density of the each small region, calculating a second dimension correction amount in accordance with a line width dimension of the pattern to be written in the each small region, correcting the first dimension correction amount by using the second dimension correction amount, and resizing the line width dimension of the pattern by using a corrected first dimension correction amount, and outputting a result of the resizing.

2 Claims, 8 Drawing Sheets

METHOD FOR RESIZING PATTERN TO BE WRITTEN BY LITHOGRAPHY TECHNIQUE, AND CHARGED PARTICLE BEAM WRITING METHOD

CROSS-RELATION TO RELATED APPLICATION

This application is based upon and claims the benefit of priority from the prior Japanese Patent Application No. 2006-249141 filed on Sep. 14, 2006 in Japan, the entire contents of which are incorporated herein by reference.

BACKGROUND OF THE INVENTION

1. Field of the Invention

The present invention relates to a method for resizing a pattern to be written by lithography technique, and a charged particle beam writing method. More particularly, for example, the present invention relates to a method of previously resizing a pattern by using a dimension change amount of the pattern which is produced by a loading effect when performing a pattern forming after writing the pattern using electron beams, and to a writing method and apparatus for writing a pattern on a target workpiece based on resized pattern data using electron beams.

2. Description of the Related Art

Microlithography technology which forwards miniaturization of semiconductor devices is extremely important, because only this process performs forming a pattern in semiconductor manufacturing processes. In recent years, with an increase in high integration and large capacity of large-scale integrated circuits (LSI), a circuit line width required for semiconductor elements is becoming narrower and narrower. In order to form a desired circuit pattern on these semiconductor devices, a master pattern (also called a mask or a reticle) with high precision is required. Then, since the electron beam (EB) technology for writing or "drawing" a pattern has excellent resolution intrinsically, it is used for manufacturing such high precision master patterns.

Figure 14:
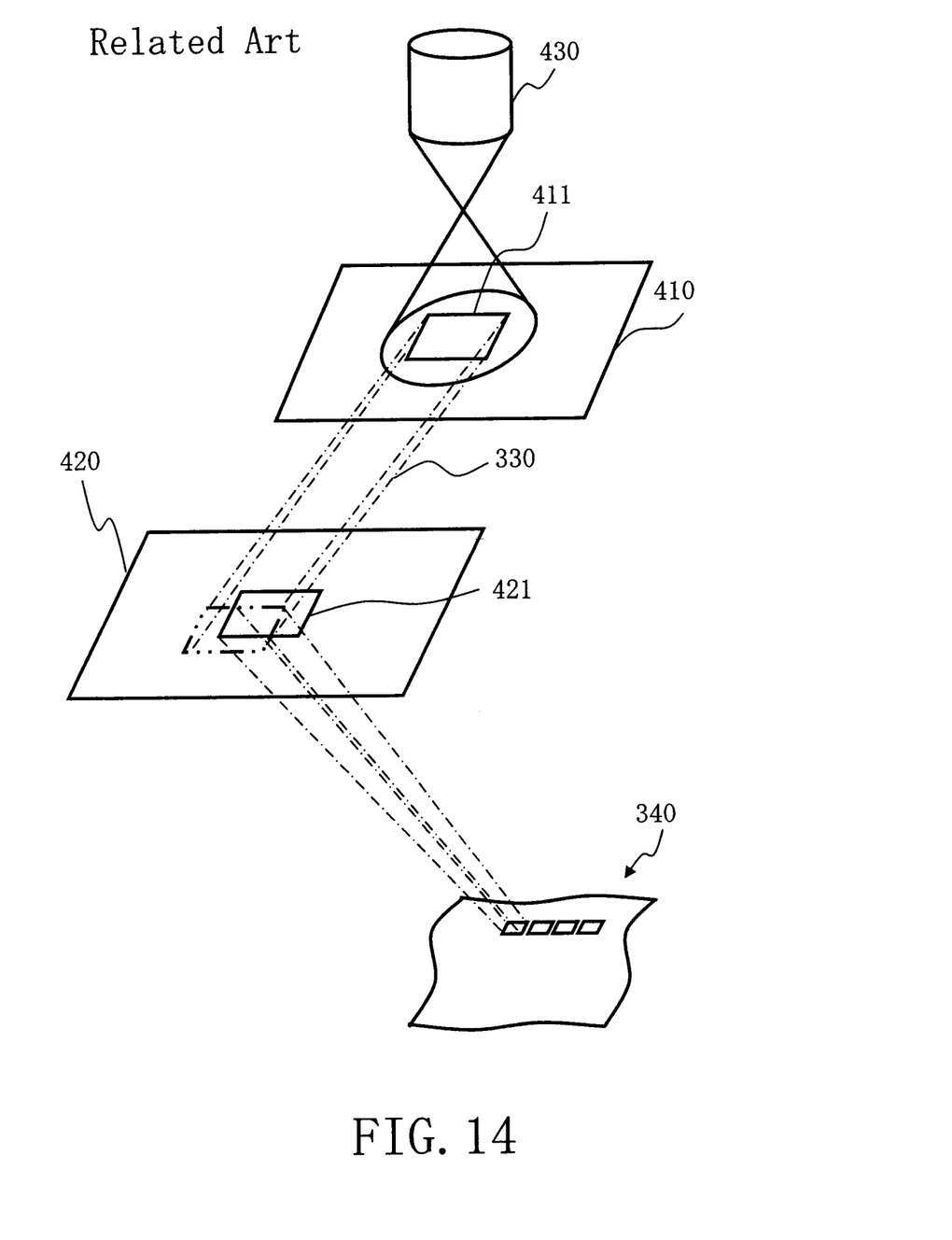
FIG. 14 shows a schematic diagram describing operations of a conventional variable-shaped electron beam writing apparatus.

FIG. 14 shows a schematic diagram describing operations of a conventional variable-shaped electron beam writing apparatus. The variable-shaped electron beam (VSB) pattern writing apparatus operates as follows: As shown in the figure, the pattern writing apparatus includes two aperture plates. A first or "upper" aperture plate 410 has an opening or "hole" 411 in the shape of a rectangle for shaping an electron beam 330. This shape of the rectangular opening may also be a square, a rhombus, a rhomboid, etc. A second or "lower" aperture plate 420 has a variable-shaped opening 421 for shaping the electron beam 330 having passed through the opening 411 of the first aperture plate 410 into a desired rectangle. The electron beam 330 that left a charged particle source 430 and has passed through the opening 411 is deflected by a deflector. Then, the electron beam 330 passes through a part of the variable-shaped opening 421 of the second aperture plate 420, and irradiates a target workpiece 340 mounted on a stage that is continuously moving in a predetermined direction (e.g. X-axis direction). In other words, a rectangular shape capable of passing through both of the opening 411 and the variable-shaped opening 421 is written in a pattern writing region of the target workpiece 340 mounted on the stage. This method of writing or "forming" a given variable shape by letting beams pass through both of the opening 411 and the specially shaped opening 421 is called a variable shaped beam (VSB) system.

In the electron beam writing mentioned above, highly precise uniformity of the line width is required in the surface of a target workpiece, such as a mask surface, when writing a pattern on the target workpiece. However, in the electron beam writing, a phenomenon called a proximity effect occurs when electron beams irradiate a circuit pattern on a mask where resist is applied. The proximity effect is generated by the backward scattering of electron beams penetrating a resist film, reaching a layer thereunder to be reflected, and being incident into the resist film again. As a result, a dimension change deviated from a desired dimension occurs when a pattern is written. On the other hand, after writing a pattern, when developing the resist film or etching the layer thereunder, a dimension change called a loading effect caused by density difference of a circuit pattern occurs.

As the loading effect being a dimension change occurring in a charged particle beam writing represented by an electron beam writing, the following can be cited as examples: a loading effect generated when developing a resist film, a loading effect generated when etching chromium (Cr) serving as a shading film under a resist film, and a loading effect generated when a pattern dimension change is produced by chemical mechanical polishing (CMP). In the electron beam writing, more highly precise uniformity of the line width in a mask surface is required with narrowing the line width of a pattern. Therefore, a loading effect correction to correct the dimension change caused by the loading effect is needed. The correction is executed, based on a design line width of a circuit pattern (design pattern), by performing writing using a dimension resized by previously estimating a dimension change amount (dimension error) caused by a loading effect, and then a desired design line width can be obtained after the loading effect produced by etching etc. For example, when a calculated dimension change amount produced by a loading effect becomes positive (direction of the line width becoming wide), the circuit pattern is irradiated after being resized so that the line width may become narrower than the design line width by the dimension change amount produced by the loading effect.

As to the loading effect correction, it is disclosed that a pattern data correction amount is calculated by adding a loading effect correction amount for correcting a dimension change produced in etching, to a process resizing amount for correcting a pattern shape error generated in writing and developing. ((Refer to, e.g., Japanese Unexamined Patent Publication No. 2004-279950 (JP-A-2004-279950))

As the method of resizing a pattern for correcting the loading effect, there are a method of performing correction by changing a dose amount of electron beams after the shot division and a method of correcting the pattern shape itself before the shot division. The latter method will be described hereinafter.

Conventionally, when correcting a pattern shape itself, namely resizing a pattern dimension, a uniform resizing amount has been used for a pattern included in a certain small region regardless of the pattern shape. However, with an increase in miniaturization of a writing pattern, problems have occurred because of using a uniform correction amount (resizing amount) for all of a pattern. For example, in the case of a resizing amount being 20 nm, if a figure pattern with a width of 1 μm is resized to be narrower, the width becomes 980 nm and its reduction rate is 2%. On the other hand, if a figure pattern with a width of 100 nm is resized to be narrower, the width becomes 80 nm and its reduction rate is 20%. That is, an over-correction is made for the figure pattern with a width of 100 nm. Thus, when using a uniform resizing amount in a small region, the writing cannot be highly precisely executed because an over-corrected pattern is formed.

BRIEF SUMMARY OF THE INVENTION

It is an object of the present invention to provide a highly precise method of resizing a pattern, with respect to a dimension change caused by a loading effect, and to provide an apparatus that writes a pattern using pattern data resized by the method.

In accordance with one aspect of the present invention, a method for resizing a pattern to be written by using lithography technique includes calculating a first dimension correction amount of a pattern for correcting a dimension error caused by a loading effect, for each small region made by virtually dividing a writing region of a target workpiece into meshes of a predetermined size, based on an area density of the each small region, calculating a second dimension correction amount in accordance with a line width dimension of the pattern to be written in the each small region, correcting the first dimension correction amount by using the second dimension correction amount, and resizing the line width dimension of the pattern by using a corrected first dimension correction amount, and outputting a result of the resizing.

In accordance with another aspect of the present invention, a method for resizing a pattern to be written by using lithography technique includes calculating a first dimension correction amount of a pattern for correcting a dimension error caused by a loading effect, for each small region made by virtually dividing a writing region of a target workpiece into meshes of a predetermined size, based on an area density of the each small region, calculating a second dimension correction amount in accordance with an adjacent pattern to be written around the pattern to be written in the each small region, correcting the first dimension correction amount by using the second dimension correction amount, and resizing a line width dimension of the pattern by using a corrected first dimension correction amount, and outputting a result of the resizing.

In accordance with another aspect of the present invention, a method for resizing a pattern to be written by using lithography technique includes calculating a first dimension correction amount of a pattern for correcting a dimension error caused by a loading effect, for each small region made by virtually dividing a writing region of a target workpiece into meshes of a predetermined size, based on an area density of the each small region, calculating a second dimension correction amount in accordance with a line width dimension of the pattern to be written in the each small region, calculating a third dimension correction amount in accordance with an adjacent pattern to be written around the pattern to be written in the each small region, correcting the first dimension correction amount by using the second and the third dimension correction amounts, and resizing the line width dimension of the pattern by using a corrected first dimension correction amount, and outputting a result of the resizing.

In accordance with another aspect of the present invention, a charged particle beam writing method includes inputting line width dimension data of a pattern, which has been resized by using a dimension correction amount calculated by correcting a basic correction amount of the pattern calculated for correcting a dimension error caused by a loading effect for each small region made by virtually dividing a writing region of a target workpiece into meshes of a predetermined size, based on an area density of the each small region, in accordance with a line width dimension of the pattern to be written in the each small region, and writing the pattern in a predetermined region of the target workpiece using a charged particle beam, based on inputted line width dimension data of the pattern.

In accordance with another aspect of the present invention, a charged particle beam writing method includes inputting line width dimension data of a pattern, which has been resized by using a dimension correction amount calculated by correcting a basic correction amount of the pattern calculated for correcting a dimension error caused by a loading effect for each small region made by virtually dividing a writing region of a target workpiece into meshes of a predetermined size, based on an area density of the each small region, in accordance with an adjacent pattern to be written around the pattern to be written in the each small region, and writing the pattern in a predetermined region of the target workpiece using a charged particle beam, based on inputted line width dimension data of the pattern.

DETAILED DESCRIPTION OF THE INVENTION

Embodiment 1

Figure 1:
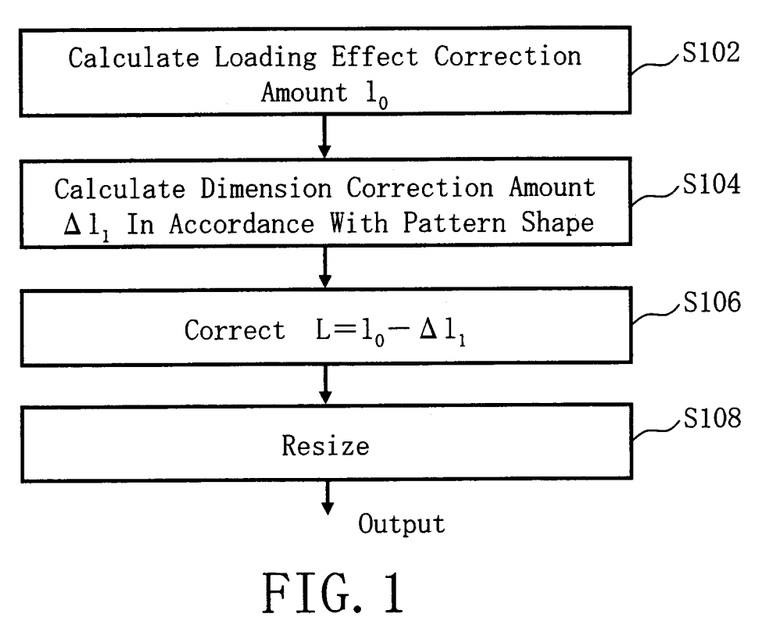
FIG. 1 is a flowchart showing main steps of a pattern resizing method described in Embodiment 1.

FIG. 1 is a flowchart showing main steps of a pattern resizing method described in Embodiment 1. In the figure, a series of steps as the resizing method of a writing pattern are executed as follows: a step of calculating a loading effect correction amount $l_0$ (S102), a step of calculating a dimension correction amount $\Delta l_1$ in accordance with a pattern shape (S104), a step of correcting the loading effect correction amount by using the dimension correction amount (S106), and a step of resizing (S108).

In S102, as a calculation step of a loading effect correction amount (an example of a first calculation step), a loading effect correction amount $l_0$ (first dimension correction amount) of each small region is calculated. First, a writing region of a mask substrate being a target workpiece is virtually divided into meshes of a predetermined size. It is preferable to set the size to be approximately equal to or less than $\frac{1}{10}$ of the influence range of the loading effect. For example, the size of about 0.5 mm to 1 mm is suitable as a mesh size.

Figure 2:
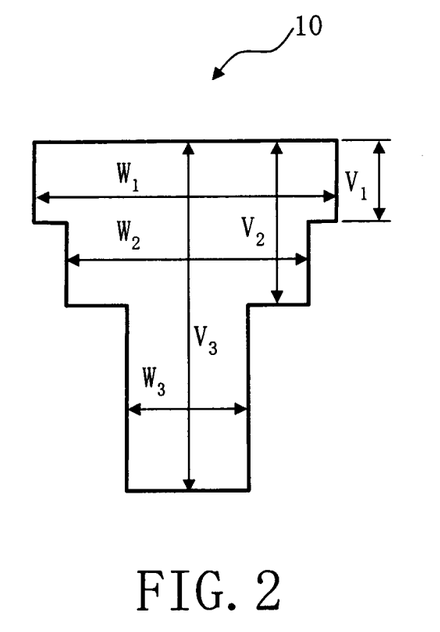
FIG. 2 shows an example of a pattern described in Embodiment 1.

FIG. 2 shows an example of a writing pattern described in Embodiment 1. For example, a figure pattern 10 shown in FIG. 2 as an example is written in one of a plurality of small regions (meshes) made by virtually dividing the writing region of a mask substrate used as a target workpiece into meshes of a predetermined size. As shown in the figure, the figure pattern 10 to be written has a line width of $V_1$-$V_3$ in the lengthwise direction and $W_1$-$W_3$ in the lateral direction.

Next, when the coordinates of each small region are defined as (i,j), an area density $\rho(i,j)$ of a pattern to be written, included in each small region is calculated. Then, by using the calculated area density $\rho(i,j)$ of the pattern and an influence coefficient $F(i,j)$ of other small region affecting the small region currently concerned, the loading effect correction amount $l_0$ (basic correction amount or the first dimension correction amount) can be calculated by the following formula (1):

$$l_0 = \Sigma F(i,j) \cdot \rho(i,j) \quad (1)$$

However, as mentioned above, since the loading effect correction amount $l_0$ calculated above is a uniform value in the small region (mesh) concerned, an over-correction may be made depending upon the line width dimension of the pattern. Therefore, a correction as described below will be executed.

In S104, as a calculation step of a dimension correction amount $\Delta l_1$ in accordance with a pattern shape (an example of a second calculation step), a dimension correction amount $\Delta l_1$ (second dimension correction amount) in accordance with a line width dimension of a pattern to be written in a small region is calculated.

Figure 3:
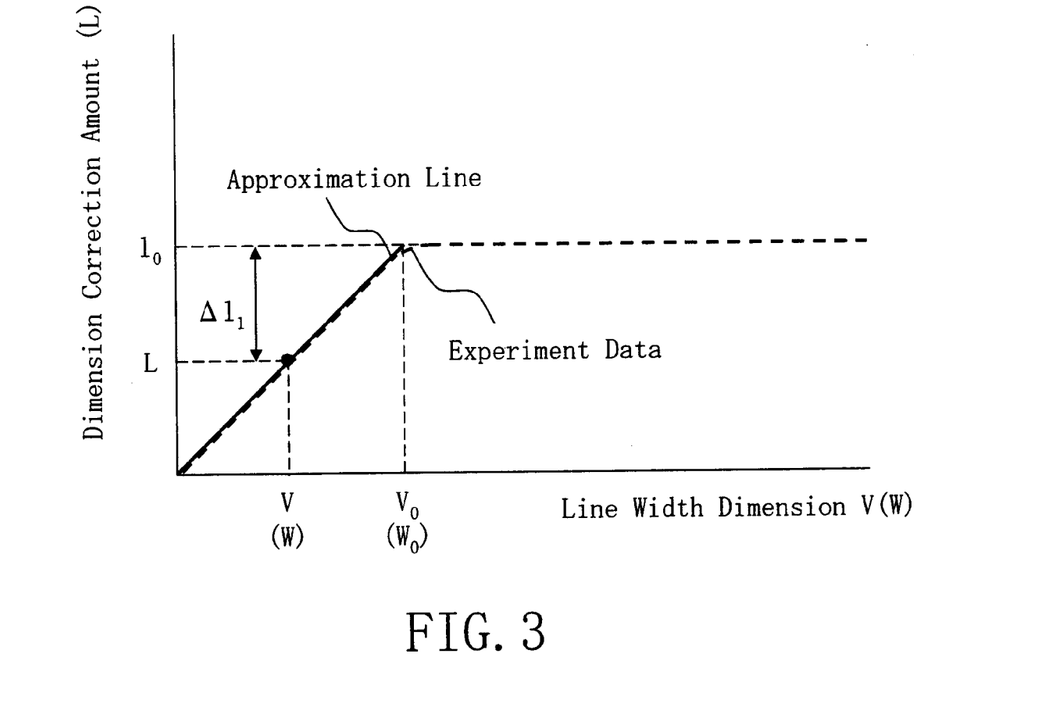
FIG. 3 shows an example of a relation between a resizing amount and a line width described in Embodiment 1.

FIG. 3 shows an example of a relation between a resizing amount and a line width described in Embodiment 1. As shown in the figure, as a result of measurement by an experiment, it is found by the inventors that in the case of a line width being narrower (smaller) than around a certain line width $V_0$, a suitable dimension correction amount L for resizing is smaller than the calculated loading effect correction amount $l_0$. Similarly, in the case of a line width being narrower than around a certain line width $W_0$ which is equal to the line width $V_0$, a suitable dimension correction amount L for resizing is smaller than the calculated loading effect correction amount $l_0$. This relation can be approximated by a linear function and shown as an approximation line in FIG. 3. In Embodiment 1, according to this relation, the dimension correction amount L for resizing is made to be the most appropriate by correcting the loading effect correction amount $l_0$ by using a calculated dimension correction amount $\Delta l_1$ in accordance with a pattern shape. That is, when a required line width V is narrower (namely, its dimensional value is smaller) than the line width $V_0$, or a required line width W is narrower (namely, its dimensional value is smaller) than the line width dimension $W_0$, the dimension correction amount $\Delta l_1$ is calculated for each dimension, based on the relation shown in FIG. 3.

In S106, as a correction step, the loading effect correction amount $l_0$ is corrected by using the dimension correction amount $\Delta l_1$ calculated in the step mentioned above. Thus, a suitable dimension correction amount L (resizing amount) can be obtained. It is possible to calculate and obtain the dimension correction amount L by the formula (2) shown below.

$$L = l_0 - \Delta l_1 \quad (2)$$

The loading effect correction amount $l_0$ is corrected by using the dimension correction amount $\Delta l_1$ herein as shown in the formula (2), but it is not restricted thereto. The loading effect correction amount $l_0$ may be calculated as the dimension correction amount L, based on the relation shown in FIG. 3.

In S108, as a resizing step, the line width dimension of the figure pattern 10 is resized by using the loading effect correction amount $l_0$ that has been corrected by the dimension correction amount $\Delta l_1$, and then the resized result is output.

Figure 4:
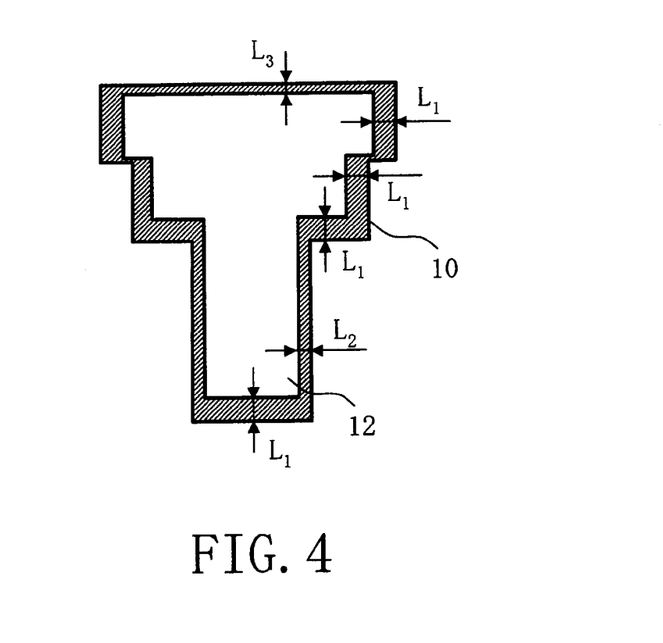
FIG. 4 shows an example of before and after resizing the figure pattern of FIG. 2.

FIG. 4 shows an example of before and after resizing the figure pattern of FIG. 2. In FIG. 4, the figure pattern 10 of before resizing and a figure pattern 12 of after resizing are shown. For example, when the line width $V_1$ and the line width $W_3$ of the figure pattern 10 shown in FIG. 2 are narrower than the line width $V_0$ (or line width $W_0$) that is used as a threshold value, the resizing amount becomes as shown in FIG. 4. With respect to the line width $V_1$, the resizing amount becomes a resizing amount $L_3$ which is smaller than the resizing amount $L_1$ that corresponds with the loading effect correction amount $l_0$. Besides, with respect to the line width dimension $W_3$, the resizing amount becomes a resizing amount $L_2$ which is smaller than the resizing amount $L_1$ that corresponds with the loading effect correction amount $l_0$. With reference to FIG. 2, the top lateral side is one side of the pattern whose line width is $V_1$, one side of the pattern whose line width is $V_2$, and one side of the pattern whose line width is $V_3$. That is, one side of the pattern whose width is the line width $V_1$ is shared as one side of the pattern whose width is the line width $V_2$ and one side of the pattern whose width is the line width is $V_3$. In this case, it is desirable to use the resizing amount $L_3$ in order not to produce an over-correction for the side shared. Thus, in the case of the pattern having a side shared by the line width dimension larger than or equal to the line width $V_0$ (or the line width $W_0$) used as a threshold value and by the line width dimension smaller than the line width $V_0$ (or the line width $W_0$), with respect to the side shared, the dimension correction amount $\Delta l_1$ is used even for the dimension of the line width larger than or equal to the line width $V_0$ (or line width $W_0$). As to other line widths larger than or equal to the line width $V_0$ (or line width $W_0$) serving as a threshold value, it is both executable to calculate the dimension correction amount $\Delta l_1$ or not to calculate it. Even if the calculation is executed, no difference is generated because the calculated value becomes 0 (zero). From a viewpoint of shortening the calculation time, it is preferable to perform calculation only for a line width narrower than the line width $V_0$ (or line width $W_0$) used as a threshold value.

As mentioned above, by correcting the loading effect correction amount $l_0$ to be in accordance with the shape of a pattern, especially a line width, the over-correction can be controlled and a more suitable dimension correction amount L (resizing amount) can be calculated.

Embodiment 2

In Embodiment 1, the resizing amount is corrected according to the shape of the pattern concerned. In Embodiment 2, the resizing amount is corrected according to the influence from a figure pattern located in the vicinity.

Figure 5:
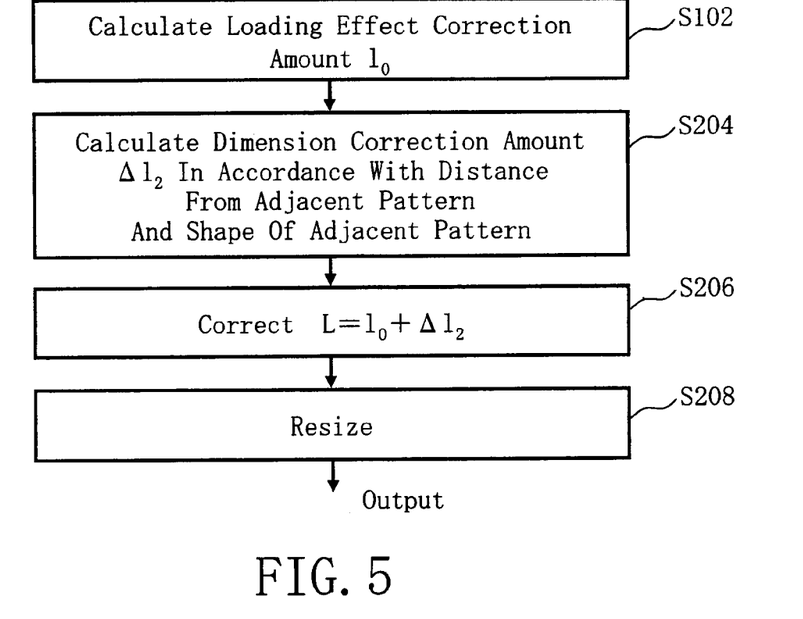
FIG. 5 is a flowchart showing main steps of a pattern resizing method described in Embodiment 2.

FIG. 5 is a flowchart showing main steps of a pattern resizing method described in Embodiment 2. In the figure, a series of steps as the resizing method of a pattern are executed as follows: a step of calculating a loading effect correction amount $l_0$ (S102), a step of calculating a dimension correction amount Δl₂ in accordance with the distance from an adjacent pattern and the shape of the adjacent pattern (S204), a step of correcting the loading effect correction amount by using the dimension correction amount (S206), and a step of resizing (S208).

Since the calculation step of the loading effect correction amount (S102) is the same as that of Embodiment 1, description thereof is omitted herein.

Figure 6:
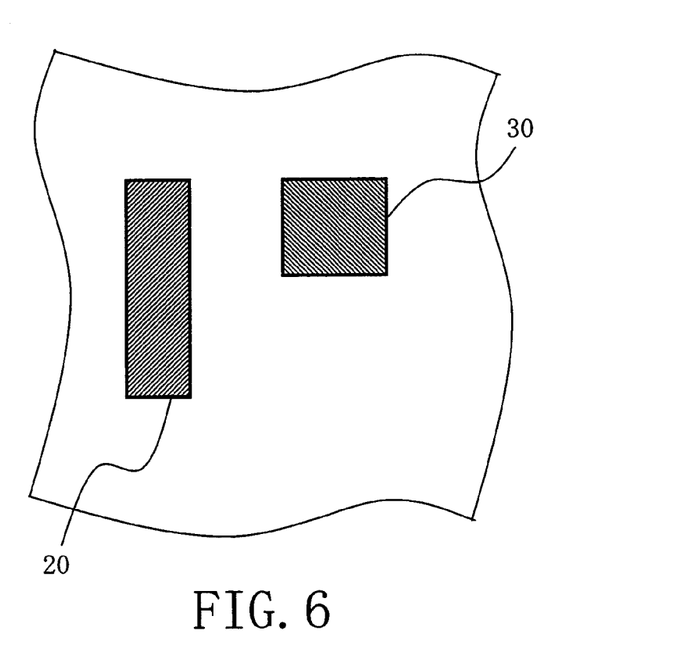
FIG. 6 shows an example of a pattern described in Embodiment 2.

FIG. 6 shows an example of a pattern described in Embodiment 2. For example, in the case of calculating the resizing amount of a figure pattern 20 shown in FIG. 6, the figure pattern 20 is affected, as the loading effect, by an adjacent figure pattern 30 located in the vicinity. Therefore, the influence of the adjacent figure pattern 30 upon the loading effect correction amount $l_0$ needs to be corrected according to Embodiment 2.

In S204, as a step of calculating a dimension correction amount Δl₂ in accordance with the distance from an adjacent pattern and the shape of the adjacent pattern (an example of the second or the third calculation step), the dimension correction amount Δl₂ (the second or the third dimension correction amount) is calculated in accordance with an adjacent pattern to be written around the pattern concerned which is to be written in a small region.

Figure 7:
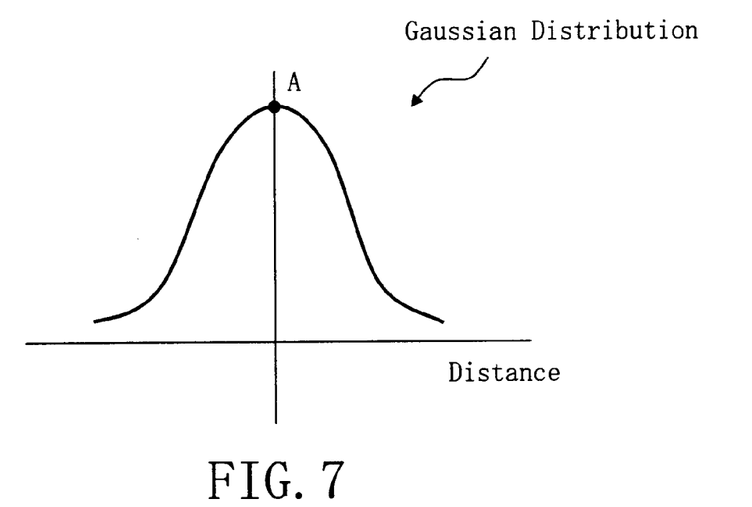
FIG. 7 shows an example of the distribution described in Embodiment 2.

Moreover, the inside of the small region (inside of the mesh) is further divided into further smaller meshes. FIG. 7 shows an example of a Gaussian distribution described in Embodiment 2. It can be considered that the influence from other region upon the unit region coordinates ($x_0$, $y_0$) being a part of the required figure pattern 20 is in accordance with the Gaussian distribution as shown in FIG. 7 as an example. The Gaussian function G (x, y, $x_0$, $y_0$) can be expressed by the formula (3) shown below.

$$G(x, y, x_0, y_0) = Ae^{-\frac{(x-x_0)^2+(y-y_0)^2}{2\delta^2}} \quad (3)$$

The coefficient A can be obtained by an experiment. The dimension correction amount Δl₂ being the influence from the adjacent figure pattern 30 upon the region coordinates ($x_0$, $y_0$) which is a part of the figure pattern 20 can be calculated by the formula (4) shown below using the Gaussian function G (x, y, $x_0$, $y_0$).

$$\Delta l_2(x_0, y_0) = \int G(x, y, x_0, y_0) \cdot f(x, y) dx dy \quad (4)$$

The probability function F (x, y) is expressed by the following formula (5):

$$f(x, y) = \begin{cases} 1 & \text{(pattern)} \\ 0 & \text{(no pattern)} \end{cases} \quad (5)$$

As no influence is given from the position of "no pattern", what is necessary is just to make the value of that position be 0 (zero). Thus, the dimension correction amount Δl₂ can be calculated by performing an integration for each second small region made by virtually dividing the small region into further smaller meshes.

Figure 8:
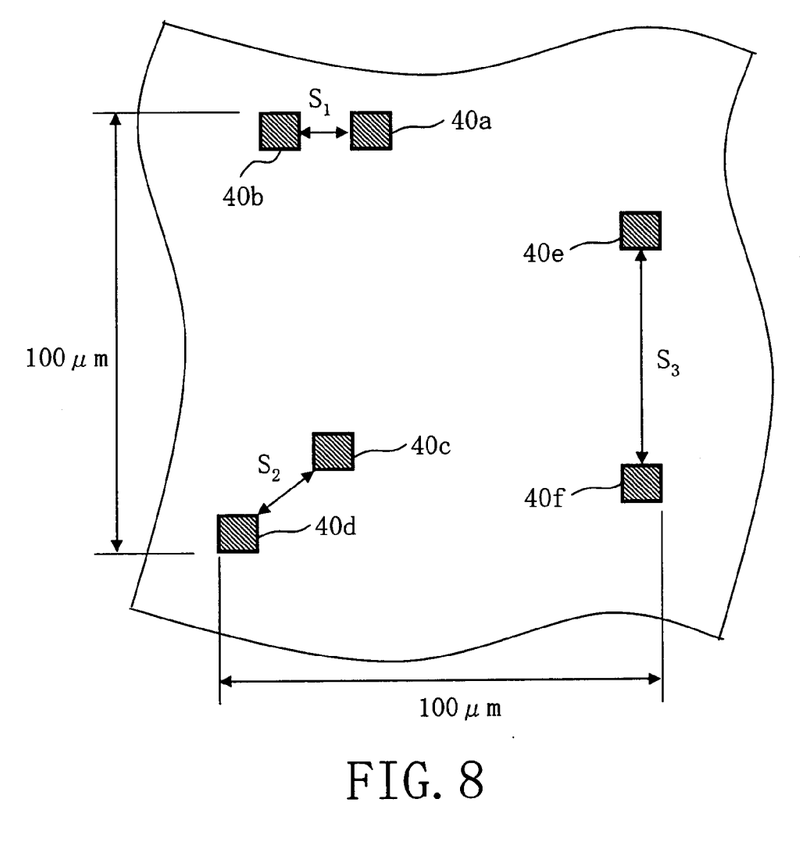
FIG. 8 shows an example of a sample pattern for checking the influence of distance between the pattern concerned and the adjacent pattern described in Embodiment 2.

FIG. 8 shows an example of a sample pattern for checking the influence of the distance between the pattern concerned and the adjacent pattern described in Embodiment 2. For example, with keeping different distances $S_1$ to $S_3$, some pairs of reference patterns 40 each having a certain unit area as shown in FIG. 8 are arranged in a large region, such as a 100 μm square, where the influence of the loading effect can be disregarded. In FIG. 8, there are provided groups: a group of a reference pattern 40a and a reference pattern 40b whose distance is $S_1$, a group of a reference pattern 40c and a reference pattern 40d whose distance is $S_2$, and a group of a reference pattern 40e and a reference pattern 40f whose distance is $S_3$. The distance between the groups is remote enough to disregard the influence of the loading effect. By writing such a sample pattern and measuring the line width after etching the pattern, the coefficient A of the Gaussian function G mentioned above may be defined.

The formula (4) can also be used to calculate with respect to all the region inside the figure pattern 20. However, since the resizing target is the perimeter sides of the pattern, it is preferable not to calculate with respect to the divided mesh at the center of the figure pattern 20 from the viewpoint of shortening the calculation time.

In S206, as a correction step, the loading effect correction amount $l_0$ is corrected by using the dimension correction amount Δl₂ calculated in the step mentioned above. Therefore, a suitable dimension correction amount (resizing amount) L can be obtained. It is possible to calculate and obtain the dimension correction amount L by the formula (6) shown below.

$$L = l_0 + \Delta l_2 \quad (6)$$

In S208, as a resizing step, the line width dimension of the figure pattern 20 is resized by using the loading effect correction amount $l_0$ that has been corrected by the dimension correction amount Δl₂, and then the resized result is output.

As mentioned above, it is possible to obtain the suitable dimension correction amount (resizing amount) L by adding the dimension correction amount Δl₂ to the loading effect correction amount $l_0$.

Embodiment 3

In Embodiment 2, calculation is performed for each unit region dxdy and each result of the calculation is added, as integrated calculation. In Embodiment 3, there will be explained a method of correcting the influenced of the adjacent pattern by a simpler way though the precision may be decreased.

Figure 9:
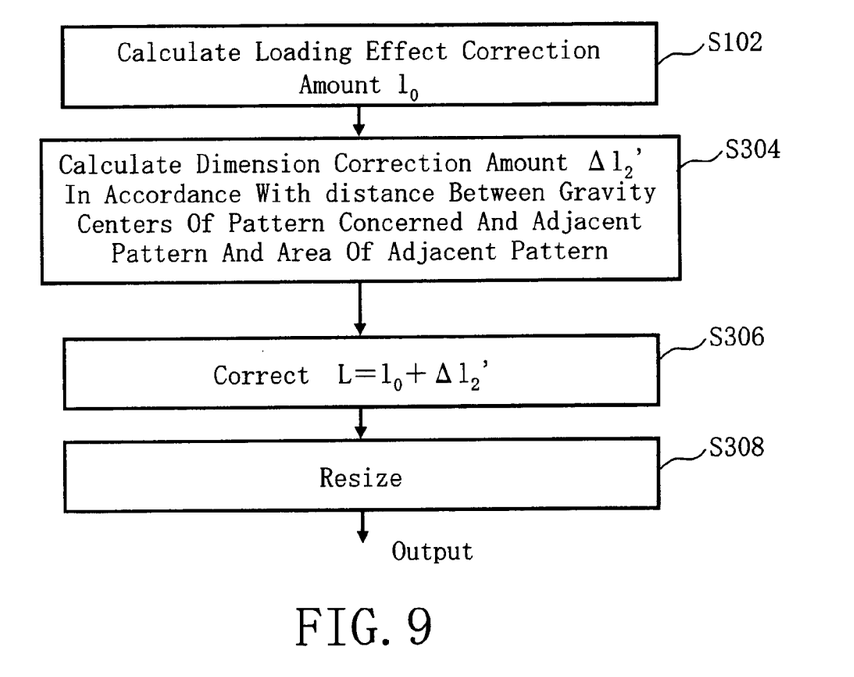
FIG. 9 is a flowchart showing main steps of a pattern resizing method described in Embodiment 3.

FIG. 9 is a flowchart showing main steps of a pattern resizing method described in Embodiment 3. In the figure, a series of steps as the resizing method of a pattern are executed as follows: a step of calculating a loading effect correction amount $l_0$ (S102), a step of calculating a dimension correction amount Δl₂' in accordance with the distance between gravity centers of the pattern concerned and an adjacent pattern and the area of the adjacent pattern (S304), a step of correcting the loading effect correction amount by using the dimension correction amount (S306), and a step of resizing (S308).

Since the calculation step of the loading effect correction amount (S102) is the same as that of Embodiment 1, description thereof is omitted herein.

Figure 10:
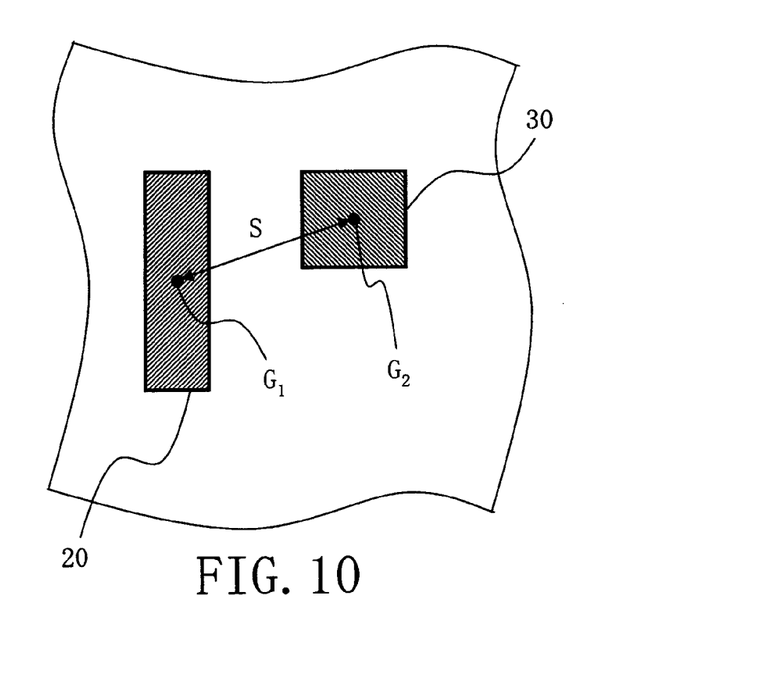
FIG. 10 shows an example of a writing pattern described in Embodiment 3.

FIG. 10 shows an example of a writing pattern described in Embodiment 3. In the figure, there shown are the figure pattern 20 and the adjacent figure pattern 30 which are the same as those in FIG. 6. According to Embodiment 3, disregarding the shape of the adjacent figure pattern 30, the influence of the adjacent figure pattern 30 upon the loading effect correction amount $l_0$ is corrected by using a distance S between the gravity centers of the gravity center G1 of the figure pattern 20 and the gravity center G2 of the adjacent figure pattern 30, and the area B of the adjacent figure pattern 30.

In S304, as a step of calculating a dimension correction amount Δl₂' in accordance with the distance between the gravity centers of the pattern concerned and an adjacent pattern and the area of the adjacent pattern (an example of the second or the third calculation step), the dimension correction amount $\Delta l_2'$ (the second or the third dimension correction amount) is calculated in accordance with an adjacent pattern to be written around the pattern concerned which is to be written in a small region. Then, the dimension correction amount $\Delta l_2'$ being the influence from the adjacent figure pattern 30 upon the figure pattern 20 can be calculated by the formula (7) shown below which is a simplified one of the formula (4) described in Embodiment 2.

$$\Delta l_2' = B \cdot A' \cdot e^{\frac{s^2}{2\delta^2}}$$
$$= B \cdot A' h(S) \tag{7}$$

The coefficient $A'h(S)$ may be obtained by an experiment in advance. Thus, as mentioned above, it is also preferable to simply calculate the dimension correction amount $\Delta l_2'$ by using the distance S between the gravity centers of the gravity center G1 of the figure pattern 20 and the gravity center G2 of the adjacent figure pattern 30, and the area B of the adjacent figure pattern 30.

In S306, as a correction step, the loading effect correction amount $l_0$ is corrected by using the dimension correction amount $\Delta l_2'$ calculated in the step mentioned above. Therefore, a suitable dimension correction amount (the resizing amount) L can be obtained. It is possible to calculate and obtain the dimension correction amount L by the formula (8) shown below.

$$L = l_0 + \Delta l_2' \tag{8}$$

In S308, as a resizing step, the line width dimension of the figure pattern 20 is resized by using the loading effect correction amount $l_0$ that has been corrected by the dimension correction amount $\Delta l_2'$, and then the resized result is output.

As mentioned above, the suitable dimension correction amount (resizing amount) L can be calculated by adding the dimension correction amount $\Delta l_2'$ to the loading effect correction amount $l_0$.

Embodiment 4

Figure 11:
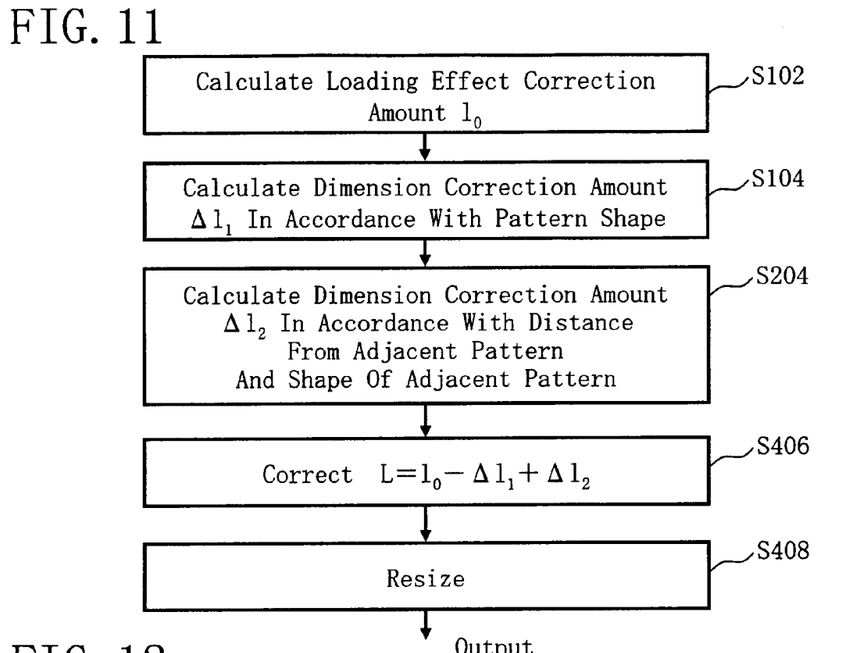
FIG. 11 is a flowchart showing main steps of a pattern resizing method described in Embodiment 4.

FIG. 11 is a flowchart showing main steps of a pattern resizing method described in Embodiment 4. In the figure, a series of steps as the resizing method of a pattern are executed as follows: a step of calculating a loading effect correction amount $l_0$ (S102), a step of calculating a dimension correction amount $\Delta l_1$ in accordance with a pattern shape (S104), a step of calculating a dimension correction amount $\Delta l_2$ in accordance with the distance from an adjacent pattern and the shape of the adjacent pattern (S204), a step of correcting the loading effect correction amount by using the dimension correction amount (S406), and a step of resizing (S408).

Since the calculation step of the loading effect correction amount (S102) and the calculation step of the dimension correction amount $\Delta l_1$ in accordance with a pattern shape (S104) are the same as those of Embodiment 1, description thereof is omitted herein. In addition, since the calculation step of the dimension correction amount $\Delta l_2$ in accordance with the distance from an adjacent pattern and the shape of the adjacent pattern (S204) is the same as that of Embodiment 2, description thereof is omitted. According to Embodiment 4, a more highly precise resizing amount L can be obtained by combining Embodiment 1 and Embodiment 2.

In S406, as a correction step, the loading effect correction amount $l_0$ is corrected by using the dimension correction amount $\Delta l_1$ and the dimension correction amount $\Delta l_2$ that are calculated in the step mentioned above. Therefore, when compared with Embodiment 1 or Embodiment 2, a more suitable dimension correction amount (resizing amount) L can be obtained by the formula (9) shown below.

$$L = l_0 - \Delta l_1 + \Delta l_2 \tag{9}$$

In S408, as a resizing step, the line width dimension of the figure pattern is resized by using the loading effect correction amount $l_0$ that has been corrected by the dimension correction amount $\Delta l_1$ and the dimension correction amount $\Delta l_2$, and then the resized result is output.

As mentioned above, it is possible to obtain a suitable dimension correction amount (resizing amount) L by subtracting the dimension correction amount $\Delta l_1$ from the loading effect correction amount $l_0$ and adding the dimension correction amount $\Delta l_2$ to the difference.

Embodiment 5

Figure 12:
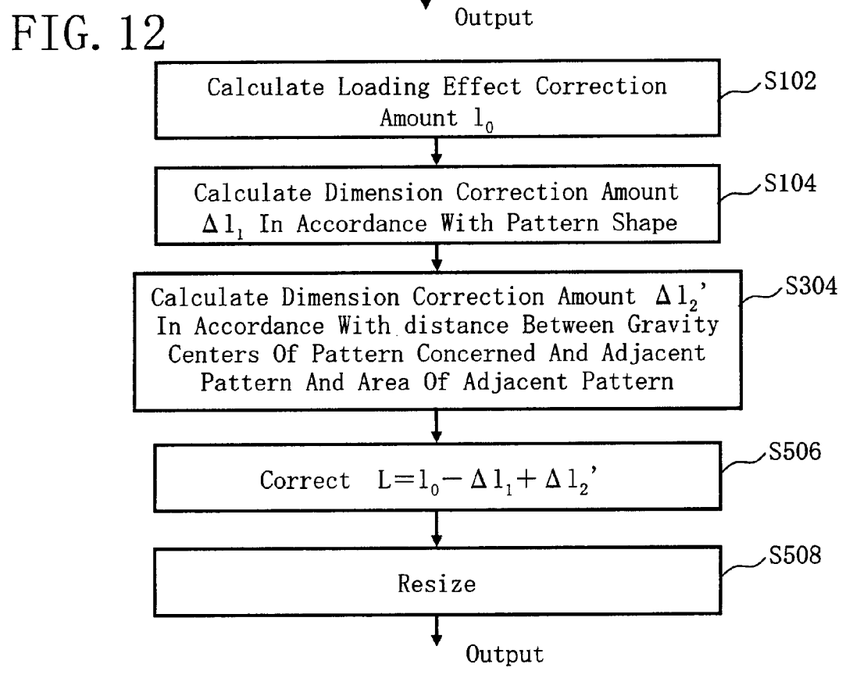
FIG. 12 is a flowchart showing main steps of a pattern resizing method described in Embodiment 4.

FIG. 12 is a flowchart showing main steps of a pattern resizing method described in Embodiment 4. In the figure, a series of steps as the resizing method of a pattern are executed as follows: a step of calculating a loading effect correction amount $l_0$ (S102), a step of calculating a dimension correction amount $\Delta l_1$ in accordance with a pattern shape (S104), a step of calculating a dimension correction amount $\Delta l_2'$ in accordance with the distance between gravity centers of the pattern concerned and an adjacent pattern and the area of the adjacent pattern (S304), a step of correcting the loading effect correction amount by using the dimension correction amount (S506), and a step of resizing (S508).

Since the calculation step of the loading effect correction amount (S102) and the calculation step of the dimension correction amount $\Delta l_2'$ in accordance with a pattern shape (S104) are the same as those of Embodiment 1, description thereof is omitted herein. In addition, since the calculation step the dimension correction amount $\Delta l_2'$ in accordance with the distance between gravity centers of the pattern concerned and an adjacent pattern and the area of the adjacent pattern (S304) is the same as that of Embodiment 3, description thereof is omitted. According to Embodiment 5, a more highly precise resizing amount L can be obtained by combining Embodiment 1 and Embodiment 3.

In S506, as a correction step, the loading effect correction amount $l_0$ is corrected by using the dimension correction amount $\Delta l_1$ and the dimension correction amount $\Delta l_2$ that are calculated in the step mentioned above. Therefore, when compared with Embodiment 1 or Embodiment 3, a more suitable dimension correction amount (resizing amount) L can be obtained by the formula (10) shown below.

$$L = l_0 - \Delta l_1 + \Delta l_2' \tag{10}$$

In S508, as a resizing step, the line width dimension of the figure pattern is resized by using the loading effect correction amount $l_0$ that has been corrected by the dimension correction amount $\Delta l_1$ and the dimension correction amount $\Delta l_2'$, and then the resized result is output.

As mentioned above, it is possible to obtain the suitable dimension correction amount (resizing amount) L by subtracting the dimension correction amount $\Delta l_1$ from the loading effect correction amount $l_0$ and adding the dimension correction amount $\Delta l_2'$ to the difference.

By performing as described above, the precision of the loading effect correction can be further enhanced. Inputting the pattern data resized by one of the methods of Embodiments mentioned above into a pattern writing apparatus, it becomes possible to write a highly precise pattern.

Figure 13:
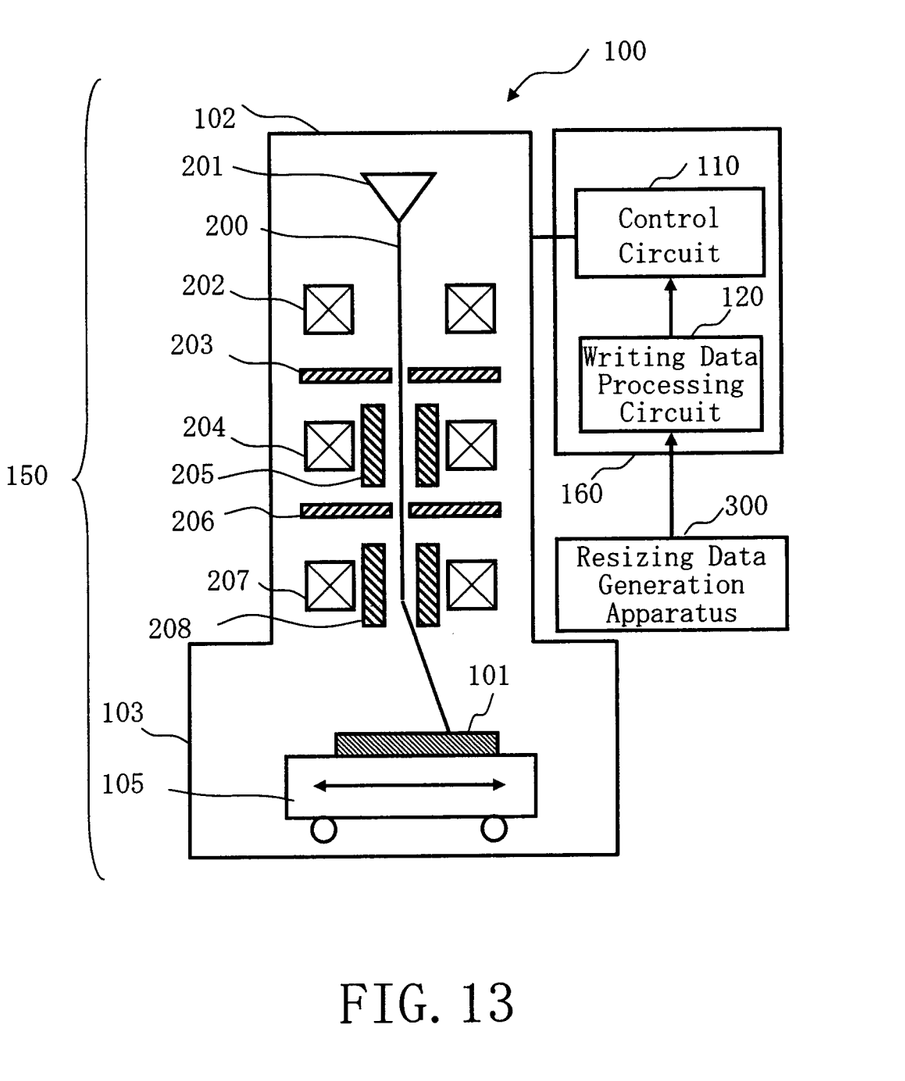
FIG. 13 is a schematic diagram showing an example of the structure of a pattern writing apparatus.

FIG. 13 is a schematic diagram showing an example of the structure of a pattern writing apparatus. In the figure, a pattern writing apparatus 100 includes a pattern writing part 150 and a control part 160. The pattern writing apparatus 100 serving as an example of a charged particle beam pattern writing apparatus writes a figure pattern on a target workpiece 101 using an electron beam being an example of a charged particle beam. The target workpiece 101 includes a mask to be used for manufacturing semiconductor devices. The control part 160 includes a control circuit 110 and a writing data processing circuit 120. The pattern writing part 150 includes an electron lens barrel 102 and a writing chamber 103. The electron lens barrel 102 includes an electron gun assembly 201, an illumination lens 202, a first aperture plate 203, a projection lens 204, a deflector 205, a second aperture plate 206, an objective lens 207, and a deflector 208. In the writing chamber 103, an XY stage 105 is arranged. On the XY stage 105, the target workpiece 101 to be written is laid or "placed".

Only the structure elements necessary for explaining the writing using resized pattern data are shown in FIG. 13. It should be understood that other structure elements may also be included in the pattern writing apparatus 100.

Moreover, in a resizing data generation apparatus 300, resized pattern data mentioned above in each Embodiment is generated and output to the writing data processing circuit 120. The writing data processing circuit 120 converts the inputted pattern data into internal data of the apparatus. Based on the internal data of the apparatus, the pattern writing part 150 is controlled by the control circuit 110 and a desired figure pattern is written on the target workpiece.

An electron beam 200 emitted from the electron gun assembly 201 irradiates the whole of the first aperture plate 203 having a rectangular opening by the illumination lens 202, for example. This shape of the rectangular opening may also be a square, a rhombus, a rhomboid, etc. At this point, the electron beam 200 is shaped to be a rectangle. Then, after having passed through the first aperture plate 203, the electron beam 200 of a first aperture image is guided by the projection lens 204 to reach the second aperture plate 206. The position of the first aperture image on the second aperture plate 206 is controlled by the deflector 205, and thereby the shape and size of the beam can be changed. After having passed through the second aperture plate 206, the electron beam 200 of a second aperture image is focus-adjusted by the objective lens 207 and deflected by the deflector 208, to reach a desired position on the target workpiece 101 placed on the XY stage 105 which is movably arranged.

As mentioned above, it becomes possible to write a more highly precise pattern on a target workpiece by using pattern data which has been resized by performing resizing more highly accurately for a dimension change produced by the loading effect.

The embodiments have been described with reference to the concrete examples. However, the present invention is not limited thereto. For example, although the Gaussian function is used in Embodiments 2 and 3, it is also preferable to use other function obtained by performing fitting (approximation) of an experimental result. For example, a double Gaussian function as shown in the following formula (11) can also be applied.

$$G(x, y, x_0, y_0) = Ae^{-\frac{(x-x_0)^2+(y-y_0)^2}{2\delta_0^2}} + Be^{-\frac{(x-x_0)^2+(y-y_0)^2}{2\delta_1^2}} \quad (11)$$

In this case, the influence ranges $\delta_0$ and $\delta_1$ may be obtained by an experiment. This is effective especially when it is difficult to perform a perfect approximation by using only one Gaussian function. Moreover, although the primary function is used in Embodiment 1, it is also preferable to use other function obtained by performing fitting (approximation) of an experimental result.

While the units which are not directly necessary for explaining the present invention, such as the structure of the apparatus and the control methods, are not described, it is possible to suitably select and use some or all of them when needed. For example, though the description of the structure of the control unit for controlling the pattern writing apparatus 100 is omitted, it should be understood that required structures of the control unit can be appropriately selected and used.

In addition, any pattern resizing method, charged particle beam writing method, and charged particle beam writing apparatus that include elements of the present invention and that can be appropriately modified by those skilled in the art are included within the sprit and scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for resizing a pattern to be written by using lithography technique comprising:

calculating, with a resizing data generation apparatus, a first dimension correction amount of a pattern for correcting a dimension error caused by a loading effect, for each small region made by virtually dividing a writing region of a target workpiece into meshes of a predetermined size, based on an area density of the each small region;

calculating, with said resizing data generation apparatus, a second dimension correction amount in accordance with an adjacent pattern to be written around a pattern to be written in the each small region, said second dimension correction amount being calculated by using a result of an experiment using groups of reference patterns in which a distance between the groups is remote enough to disregard an influence of the loading effect;

correcting, with said resizing data generation apparatus, the first dimension correction amount by using the second dimension correction amount; and resizing, with said resizing data generation apparatus, a line width dimension of the pattern by using a corrected first dimension correction amount, and outputting a result of the resizing, wherein the second dimension correction amount is calculated by using an area of the adjacent pattern and a distance between gravity centers of the pattern to be written and the adjacent pattern.

2. The method according to claim 1, wherein the second dimension correction amount is calculated by performing an integration calculation for each second small region made by further virtually dividing the small region into meshes.

* * * * *